(12) United States Patent
Naoi et al.

(10) Patent No.: US 8,819,952 B2
(45) Date of Patent: Sep. 2, 2014

(54) CONTROL DEVICE FOR A PARALLEL SLIDER DEVICE, CONTROL METHOD AND MEASURING DEVICE USING SAME

(75) Inventors: Kaoru Naoi, Yokohama (JP); Yoichi Ishizaki, Sodegaura (JP); Tatsuhito Inouchi, Ichihara (JP); Masahiro Iwasaki, Yokohama (JP)

(73) Assignee: Kuroda Precision Industries Ltd., Kawasaki-shi, Kanagawa (JP)

( * ) Notice: Subject to any disclaimer, the term of this patent is extended or adjusted under 35 U.S.C. 154(b) by 225 days.

(21) Appl. No.: 13/261,431

(22) PCT Filed: Mar. 10, 2010

(86) PCT No.: PCT/JP2010/001715
§ 371 (c)(1),
(2), (4) Date: Sep. 7, 2012

(87) PCT Pub. No.: WO2011/111101
PCT Pub. Date: Sep. 15, 2011

(65) Prior Publication Data
US 2013/0008042 A1 Jan. 10, 2013

(51) Int. Cl.
| | | |
|---|---|---|
| *G01B 5/25* | (2006.01) | |
| *H01L 21/67* | (2006.01) | |
| *G01B 5/00* | (2006.01) | |
| *G01B 11/30* | (2006.01) | |
| *G05B 19/19* | (2006.01) | |
| *G01B 7/34* | (2006.01) | |

(52) U.S. Cl.
CPC ........ *G01B 11/306* (2013.01); *H01L 21/67288* (2013.01); *G01B 5/0009* (2013.01); *G05B 2219/41264* (2013.01); *G05B 2219/41007* (2013.01); *G05B 2219/42336* (2013.01); *G05B 19/19* (2013.01); *G01B 7/345* (2013.01)
USPC .............................................. 33/533; 33/549

(58) Field of Classification Search
USPC .................... 33/1 M, 503, 533, 549, 568, 573
See application file for complete search history.

(56) References Cited

U.S. PATENT DOCUMENTS

| | | | |
|---|---|---|---|
| 5,575,075 A * | 11/1996 | Sasaki .............................. | 33/503 |
| 5,699,621 A * | 12/1997 | Trumper et al. ............... | 33/1 M |
| 6,367,159 B1 | 4/2002 | Naoi et al. | |
| 6,442,857 B1* | 9/2002 | Atsuhiko et al. ................ | 33/1 M |
| 6,826,840 B1* | 12/2004 | Lindsey et al. .................. | 33/503 |
| 7,165,331 B1* | 1/2007 | Lindsey et al. .................. | 33/549 |
| 7,239,050 B2* | 7/2007 | Miyamoto .................. | 310/12.01 |
| 7,392,692 B2* | 7/2008 | Noda .............................. | 33/503 |
| 2004/0263108 A1* | 12/2004 | Lim et al. ......................... | 33/568 |
| 2010/0083517 A1* | 4/2010 | Guasco ............................ | 33/503 |
| 2014/0071460 A1* | 3/2014 | Suzuki ............................. | 33/503 |

FOREIGN PATENT DOCUMENTS

| | | |
|---|---|---|
| JP | 11-351857 A | 12/1999 |
| JP | 2005-99981 A | 4/2005 |
| JP | 2008-067463 A | 3/2008 |
| JP | 4132503 B2 | 8/2008 |

* cited by examiner

*Primary Examiner* — G. Bradley Bennett
(74) *Attorney, Agent, or Firm* — Marshall & Melhorn, LLC (57) ABSTRACT

In a parallel slider device, the two sliders are allowed to move in a smooth manner without interfering with each other. A same position command is given to a front servo controller for a front linear servo motor and a rear servo controller for a rear linear servo motor, and the front servo controller and the rear servo controller are provided with mutually different control gains.

12 Claims, 5 Drawing Sheets

CONTROL DEVICE FOR A PARALLEL SLIDER DEVICE, CONTROL METHOD AND MEASURING DEVICE USING SAME

FIELD OF THE INVENTION

The present invention relates to a control device for a parallel slider device, a control method therefor and a measuring device using the same, and in particular to a control device for a parallel slider device including a pair of sliders mechanically coupled with each other and slidably guided by respective guide rails disposed in parallel to each other, a control method therefor and a measuring device using the same.

BACKGROUND ART

A known measuring device for measuring the flatness (thickness variations) of the front and back sides of a thin disk (measuring object) having a large diameter such as a 300 mm diameter silicon wafer includes a support unit for supporting a measuring object in parallel with a prescribed plane such as a vertical plane, a first and second linear guide rail extending in parallel with the prescribed plane on either side of the measuring object, a first and second slider individually slidably supported by the first and second guide rails, respectively, a first measuring means (displacement meter) mounted on the first slider for measuring a distance to the front side (front face) of the measuring object, and a second measuring means for measuring a distance to the back side (rear face) of the measuring object. See Patent Document 1, for instance.

In such a measuring device, an individual air slide mechanism is required to be provided on each side of the support unit supporting the measuring object (extending vertically). By placing each guide rail at a height corresponding to the height at which the displacement meter scans the measuring object such as a silicon wafer, the distance between the guide rail and the displacement meter can be reduced as compared to the case where the guide rail is provided in a lower part of the support unit.

Thereby, the roll error caused by the angular displacement of the slider around the axial center line of the guide rail can be minimized as this error increases in proportion to the vertical distance between the guide rail and the displacement meter. By reducing the roll error, the flatness of both the front and back sides can be individually measured at a high precision.

PRIOR ART DOCUMENT(S)

Patent Document(s)

Patent Document 1: JP11-351857A

However, in this case, because the air slide mechanism is provided individually on each of the front and back sides of the support unit, the two sliders are required to be individually actuated in synchronism, and any unevenness in the traversing speeds of the two sliders could cause errors in the measuring position of the measuring object between the front and back sides thereof. This would cause errors in the measurement of the thickness of the measuring object.

Based on this consideration, the inventors of the present invention have considered the possibility of mechanically coupling the two sliders with the aim of removing the unevenness in the traversing speeds of the two sliders.

In this case, the driving means of each of the sliders that are mechanically coupled with each other is controlled by an individual position control unit such as a linear servo motor, and the positional deviation between the two sliders is avoided by feeding a same positioning command to the two position control units to keep them in synchronism.

However, as the two sliders are mechanically coupled with each other, the movements that are caused by the linear servo motors are restrained by the mechanical coupling. Also, the mechanical properties of the two sliders including the weights of the linear servo motors and the slider themselves may not be quite identical between the two sliders. For these reasons, even when a same positioning command is supplied to the two position control units, the gains in the positioning controls and the resulting operations may not be the same, and mutual interferences may prevent the smooth operation of the sliders.

A primary object of the present invention is, in a parallel slider device of the type discussed above, to prevent the two sliders from interfering each other and ensure a smooth movement of the two sliders.

MEANS TO ACCOMPLISH THE TASK

The present invention provides a control device for a parallel slider device, the parallel slider device comprising a first guide rail and a second guide rail that are disposed parallel to each other, a first slider and a second slider slidably supported by the first and second guide rails, respectively, along a lengthwise direction of the guide rails, a coupling means for mechanically coupling the first and second sliders to each other and a first electric servo actuator and a second electric servo actuator for driving the first slider and a second slider, respectively, in the lengthwise direction of the guide rails, wherein the control device comprises a first position control unit for controlling an operation of the first electric servo actuator and a second position control unit for controlling an operation of the second electric servo actuator, and wherein a same position command is given to the first and second position control units, and the first and second position control units are provided with mutually different control gains.

In a preferred embodiment of the control device for a parallel slider device according to the present invention, the control gain for the first position control unit consists of an optimum value based on a system identification, and the control gain for the second position control unit consists of a value smaller than the optimum value based on a system identification.

In another embodiment of the control device for a parallel slider device according to the present invention, the first position control unit and the second position control unit each consist of a feedback compensation control device, and the control gain comprises a position loop gain set by a position loop gain setting unit for each of the first and second position control units, and wherein the position loop gain setting unit for the first position control unit is configured to set a gain for a PI control including a proportional control element and an integral control element or for a PID control including a proportional control element, an integral control element and a differential control element, and the position loop gain setting unit for the second position control unit is configured to set a gain for a P control including only a proportional control element.

In yet another embodiment of the control device for a parallel slider device according to the present invention, the first position control unit and the second position control unit each consist of a feedback compensation control device, and wherein the first position control unit includes a position loop, a speed loop and an acceleration loop in cascade connection, and the second position control unit includes a position loop and a speed loop in cascade connection.

The present invention also provides a control method for a parallel slider device, the parallel slider device comprising a first guide rail and a second guide rail that are disposed parallel to each other, a first slider and a second slider slidably supported by the first and second guide rails, respectively, along a lengthwise direction of the guide rails, a coupling means for mechanically coupling the first and second sliders to each other and a first electric servo actuator and a second electric servo actuator for driving the first slider and a second slider, respectively, in the lengthwise direction of the guide rails, wherein an operation of the first electric servo actuator is controlled by a first position control unit and an operation of the second electric servo actuator is controlled by a second position control unit, and wherein a same position command is given to the first and second position control units, and the first and second position control units are provided with mutually different control gains.

In a preferred embodiment of the control method for a parallel slider device according to the present invention, the control gain for the first position control unit consists of an optimum value based on a system identification, and the control gain for the second position control unit consists of a value smaller than the optimum value based on a system identification.

In another preferred embodiment of the control method for a parallel slider device according to the present invention, the first position control unit and the second position control unit each consist of a feedback compensation control device, and the control gain comprises a position loop gain set by a position loop gain setting unit for each of the first and second position control units, and wherein the position loop gain setting unit for the first position control unit is configured to set a gain for a PI control including a proportional control element and an integral control element or for a PID control including a proportional control element, an integral control element and a differential control element, and the position loop gain setting unit for the second position control unit is configured to set a gain for a P control including only a proportional control element.

In yet another preferred embodiment of the control method for a parallel slider device according to the present invention, the first position control unit and the second position control unit each consist of a feedback compensation control device, and wherein the first position control unit includes a position loop, a speed loop and an acceleration loop in cascade connection, and the second position control unit includes a position loop and a speed loop in cascade connection.

The present invention further provides a measuring device, comprising: a first guide rail and a second guide rail that are disposed parallel to each other; a first slider and a second slider slidably supported by the first and second guide rails, respectively, along a lengthwise direction of the guide rails; a coupling means for mechanically coupling the first and second sliders to each other; a first electric servo actuator and a second electric servo actuator for driving the first slider and a second slider, respectively, in the lengthwise direction of the guide rails; a support unit disposed between the first guide rail and the second guide rail to support a measuring object; a first measuring means mounted on the first slider for measuring a distance to a first side of the measuring object; a second measuring means mounted on the second slider for measuring a distance to a second side of the measuring object; and a control device for a parallel slider device as defined above.

EFFECT OF THE INVENTION

According to the control device for a parallel slider device of the present invention, because the first and second position control units are provided with mutually different control gains, the one having a higher control gain serves as a master side, and the one having a lower control gain serves as a slave side such that the slider on the slave side is made to follow the movement of the slider on the master side. As a result, a smooth movement of the two slider is ensured. In this case, the higher control gain may be an optimum value based on a system identification, and the lower control gain may be a smaller value than the optimum value based on a system identification.

Providing the first and second position control units with mutually different control gains may be accomplished in various different ways in addition to directly varying system parameters such as control gains. For instance, the first position control unit may be based on a PID or PI control while the second position control unit is based on a simple P control. Alternatively, the modes of the cascade connections of the control loops in the feedback compensation control may be varied between the first position control unit and the second position control unit.

PREFERRED EMBODIMENT(S) OF THE INVENTION

Now the present invention is described in the following in more detail in terms of concrete embodiments with reference to the appended drawings. In the following description, the directions such as the fore and aft, vertical and lateral directions are based on the directions indicated in the relevant drawings.

Figure 1:
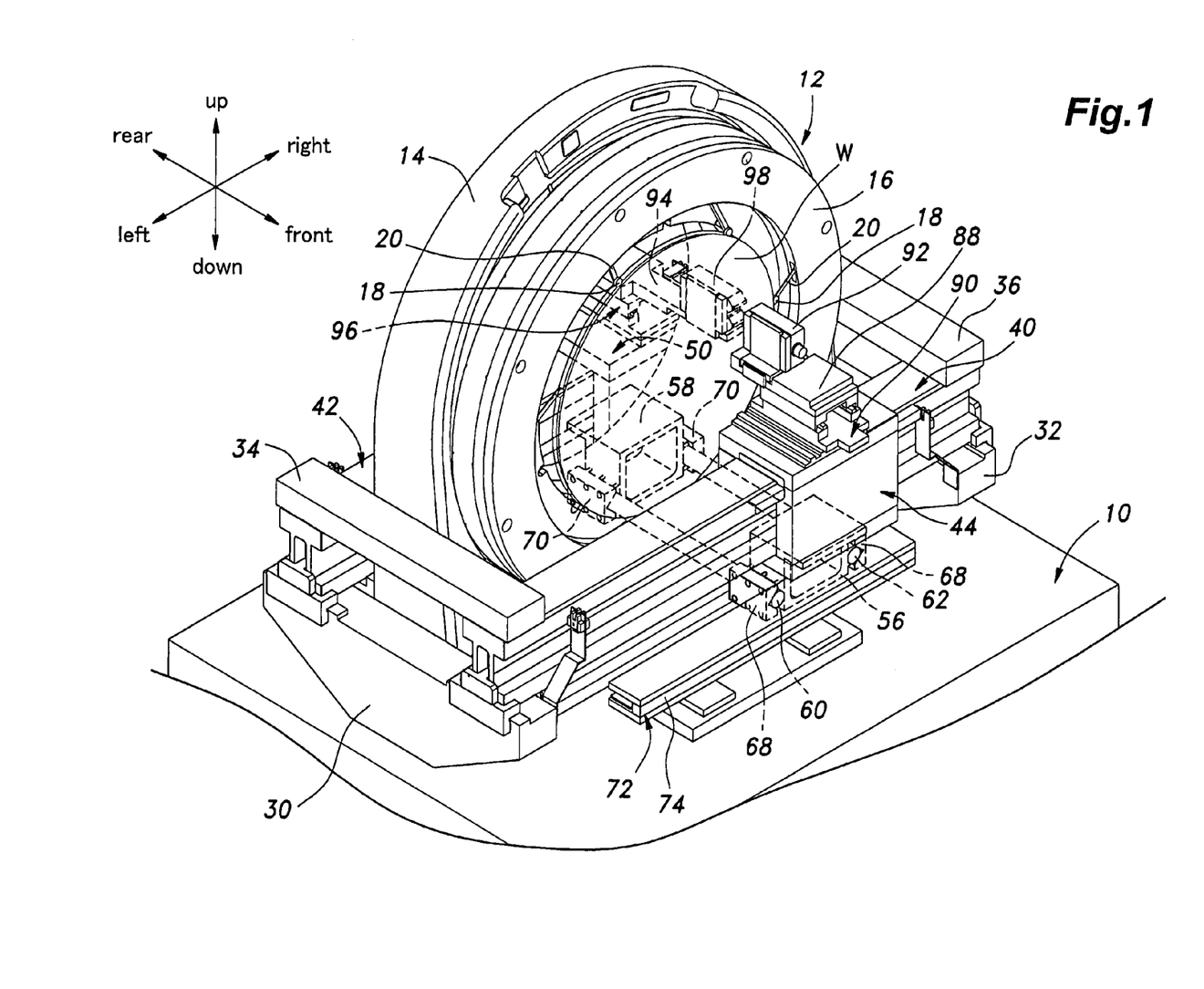
FIG. 1 is a perspective view showing a wafer flatness measuring device using parallel slider device using a pneumatic linear guide given as an embodiment of the present invention.
Figure 2:
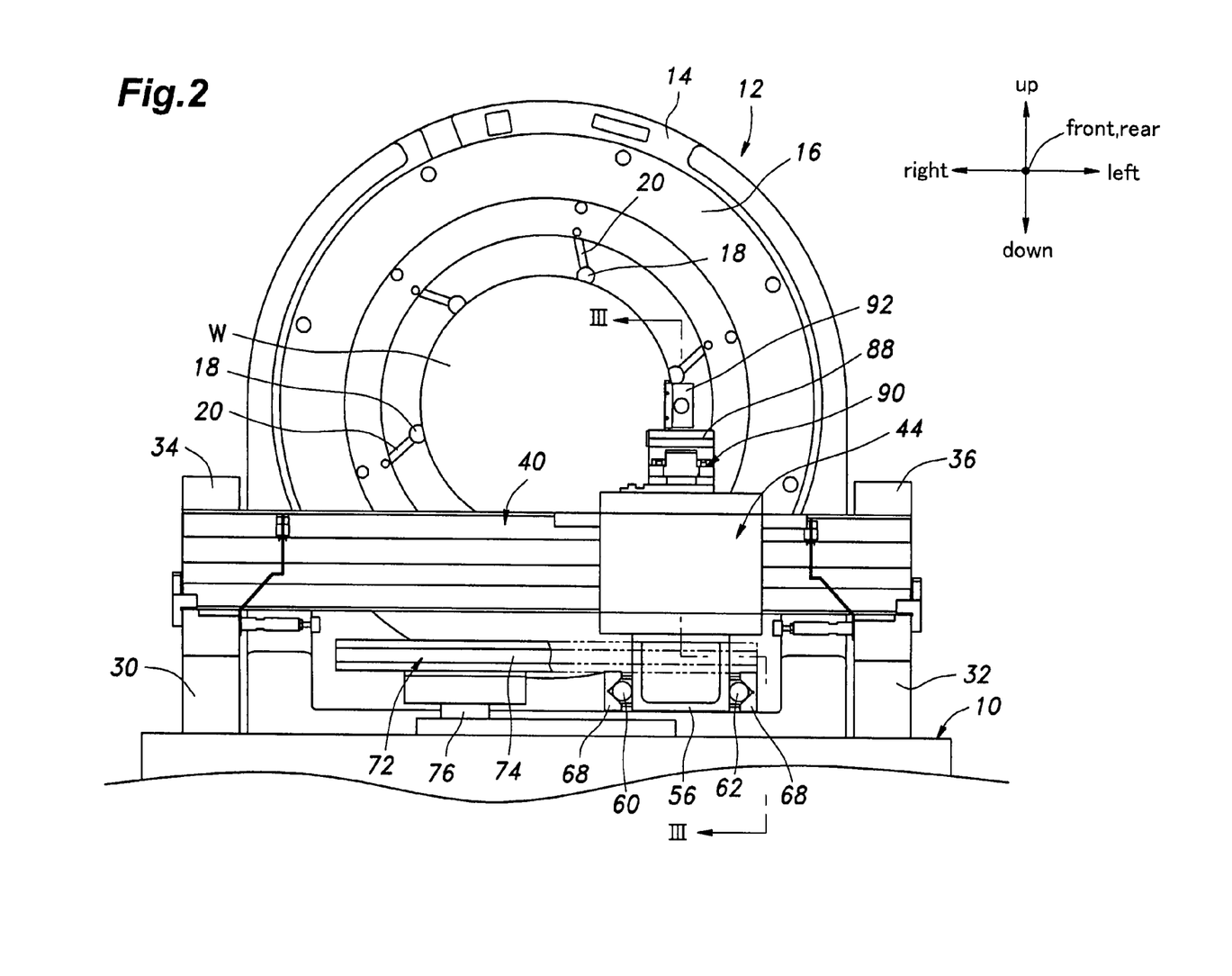
FIG. 2 is a front view of the wafer flatness measuring device.

As shown in FIGS. 1 and 2, a support unit 12 is placed on a horizontal upper surface of a base unit 10. The support unit 12 is configured to support a measuring object consisting of a disk-shaped silicon wafer W, and comprises an arch-shaped fixed base member 14 fixedly attached to the base unit 10 and an annular rotatable member 16 rotatably mounted on the fixed base member 14.

The annular rotatable member 16 is rotatably supported by the fixed base member 14 so as to be rotatable around a horizontal central axial line extending in the fore and aft direction via a fluid bearing or air bearing (not shown in the drawings). The inner periphery of the annular rotatable member 16 is provided with a plurality of support arms 20 each having a free end fitted with a roller 18 and arranged at a regular circumferential interval. The support arms 20 jointly support the silicon wafer W within the inner space of the annular rotatable member 16 in a vertical orientation with each roller 18 engaging the outer circumferential groove (not shown in the drawings) of the silicon wafer W. For more details of the structure for supporting the silicon wafer W, reference may be made to JP 4132503B.

Although not shown in the drawings, the support unit 12 is incorporated with a brushless DC motor using the fixed base member 14 as the stator member and the annular rotatable member 16 as the rotor. This brushless DC motor drivingly rotates the annular rotatable member 16.

A pair of end brackets 30 and 32 are laterally arranged on the upper face of the base unit 10. The end brackets 30 and 32 are located on either lateral side of the support unit 12, and fixedly support the left ends of the and right ends of a front guide rail (first guide rail) 40 and a rear guide rail (second guide rail) 42 and the right ends of the front guide rail 40 and the rear guide rail 42, respectively, at the upper ends thereof.

More specifically, the front guide rail 40 consists of a linear rail having an I-shaped cross section including a lateral flange (40A, 40B) in each of the upper and lower ends thereof (see FIG. 3), and extends between the end brackets 30 and 32 with the lateral ends thereof fixedly secured to the upper parts of the corresponding end brackets 30 and 32 so as to extend horizontally along the front side of the support unit 12.

Figure 3:
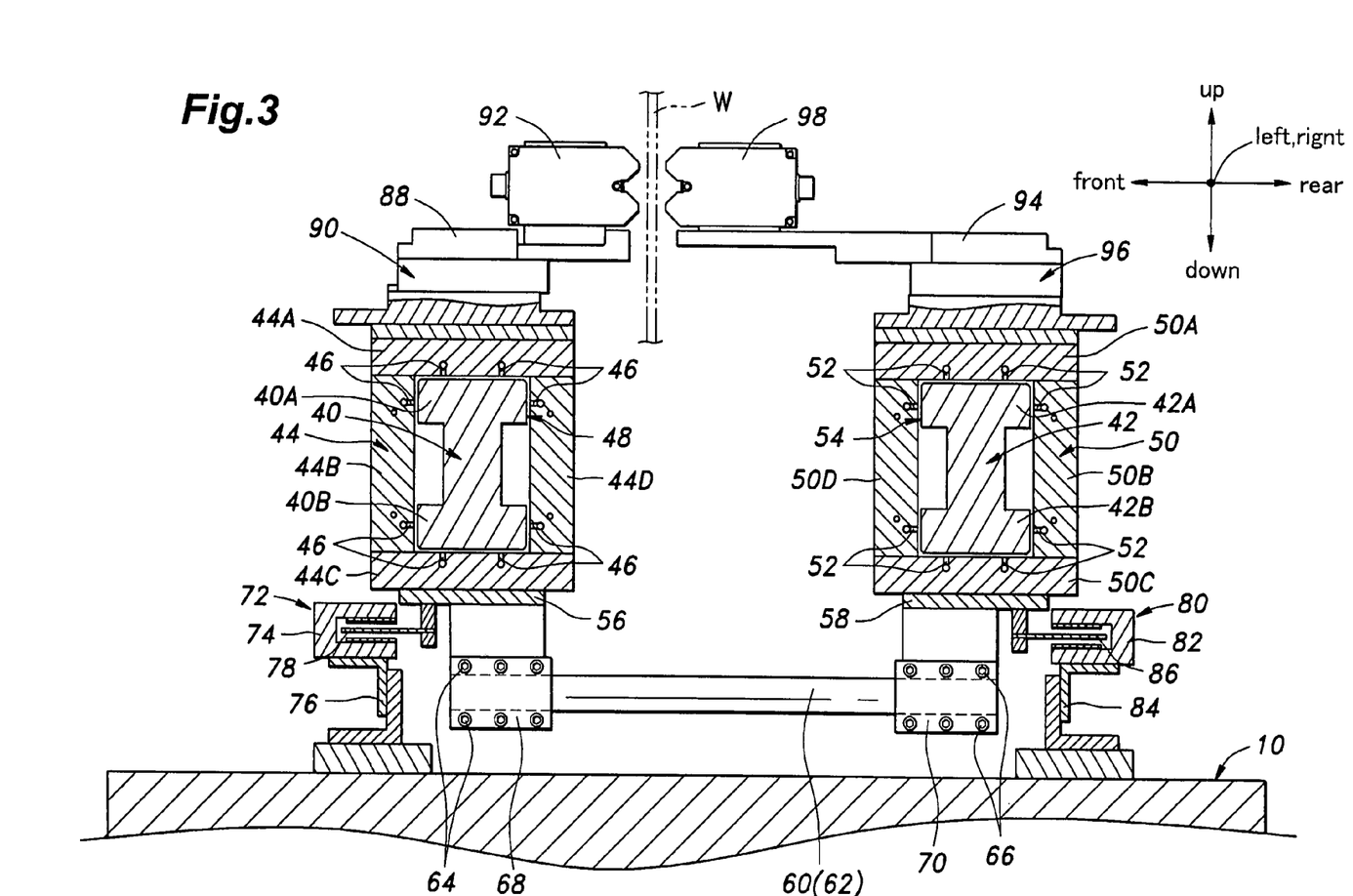
FIG. 3 is a sectional view taken along line III-III of FIG. 2.

Likewise, the rear guide rail 42 consists of a linear rail having an I-shaped cross section including a lateral flange (42A, 42B) in each of the upper and lower ends thereof, and extends between the end brackets 30 and 32 with the lateral ends thereof fixedly secured to the upper parts of the corresponding end brackets 30 and 32 so as to extend horizontally along the back side of the support unit 12.

The front guide rail 40 and the rear guide rail 42 extend in parallel to each other at a same elevation.

The front guide rail 40 and the rear guide rail 42 are connected to each other at each of their lateral ends by a reinforcing connecting plate 34, 36 fixedly attached to the upper faces of the guide rails 40 and 42.

A front slider (first slider) 44 is supported on the front guide rail 40 so as to be moveable laterally or along the length of the guide rail. The front slider 44 is shaped as a rectangular tube by four rectangular plate members 44A to 44D that surround the front guide rail 40.

An air gap G1 (see FIG. 5) is defined between the inner faces of the four rectangular plate members 44A to 44D and the opposing faces of the front guide rail 40 that include the upper face and the fore and aft faces of the upper flange 40A and the lower face and the fore and aft faces of the lower flange 40B, and air ejection ports 46 are formed in the rectangular plate members 44A to 44D so as to face the opposing faces (see FIG. 3).

Figure 5:
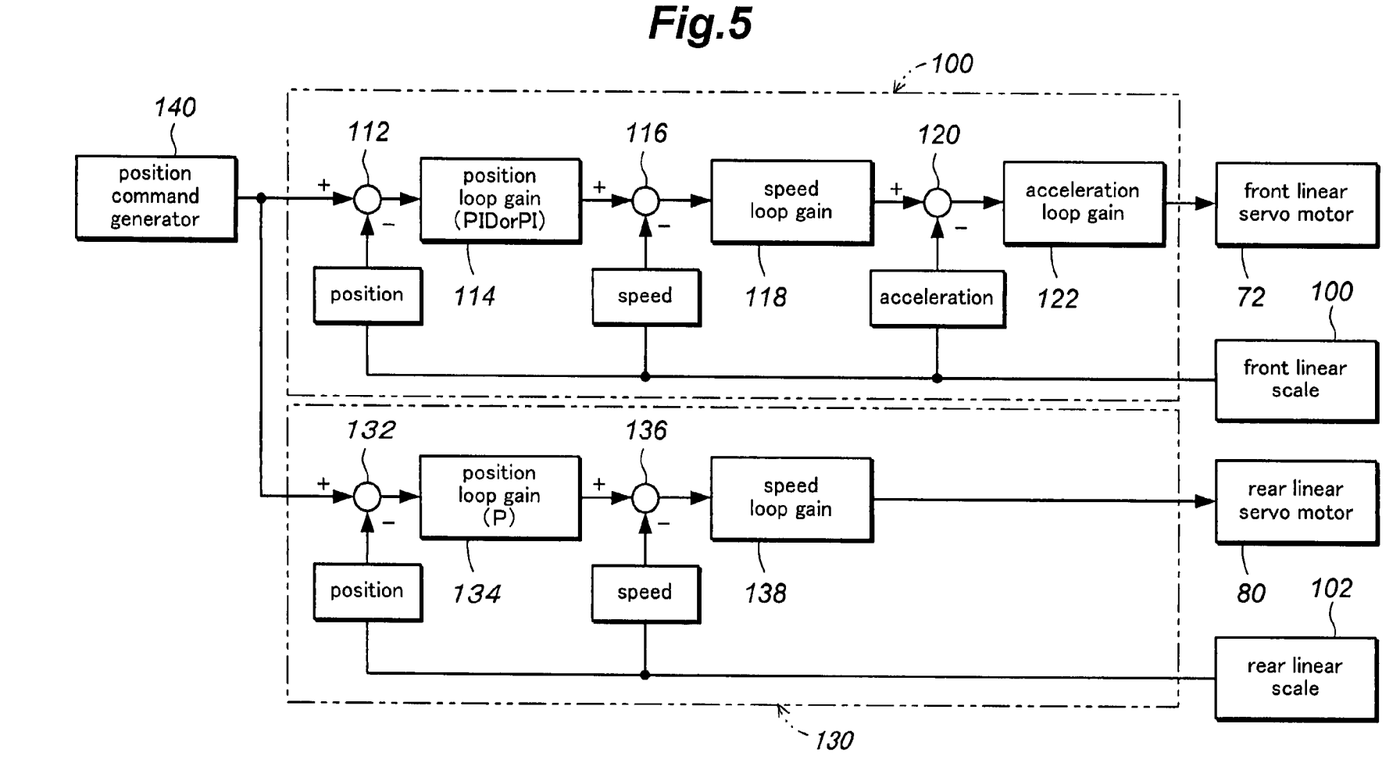
FIG. 5 is a block diagram of control system that is used in the parallel slider device using a pneumatic linear guide given as the embodiment of the present invention and the execution of the control process thereof.

To each air ejection port 46 is supplied a compressed air supplied from a compressed air source 100 and regulated to a first pressure P1 by a first pressure regulator 102 (see FIG. 5). Thereby, a first pneumatic linear guide 48 consisting of a fluid bearing is formed between the front guide rail 40 and the front slider 44. The linear movement of the front slider 44 along the length of the front guide rail 40 is thus performed in a contactless manner via the first pneumatic linear guide 48.

Likewise, a rear slider (second slider) 50 is supported on the rear guide rail 42 so as to be moveable laterally or along the length of the guide rail. The rear slider 50 is shaped as a rectangular tube by four rectangular plate members 50A to 50D that surround the rear guide rail 42.

An air gap G2 (see FIG. 5) is defined between the inner faces of the four rectangular plate members 50A to 50D and the opposing faces of the rear guide rail 42 that include the upper face and the fore and aft faces of the upper flange 42A and the lower face and the fore and aft faces of the lower flange 42B, and air ejection ports 52 are formed in the rectangular plate members 50A to 50D so as to face the opposing faces (see FIG. 3).

To each air ejection port 52 is supplied a compressed air supplied from the compressed air source 100 and regulated to a second pressure P2 by a second pressure regulator 104 (see FIG. 5). Thereby, a second pneumatic linear guide 54 consisting of a fluid bearing is formed between the rear guide rail 42 and the rear slider 50. The linear movement of the rear slider 50 along the length of the rear guide rail 42 is thus performed in a contactless manner via the second pneumatic linear guide 54.

The air gaps of the first and second pneumatic linear guides 48 and 54 are exaggerated in FIGS. 3 and 5.

A connecting base member 56, 58 is fixedly attached to the bottom face of each of the front slider 44 and the rear slider 50. A pair of connecting rods 60 and 62 are connected between the two connecting base members 56 and 58 at either side thereof with each end of the connecting rods 60 and 62 fixedly connected to the corresponding side face of the corresponding base member via a V-block clamping member 68, 70 which is fastened to the corresponding base member side face with fastening screws 64, 66 (see FIG. 4). Thereby, the front slider 44 and the rear slider 50 are fixedly secured to each other with respect to both the lateral direction (scanning direction) and the fore and aft direction.

Figure 4:
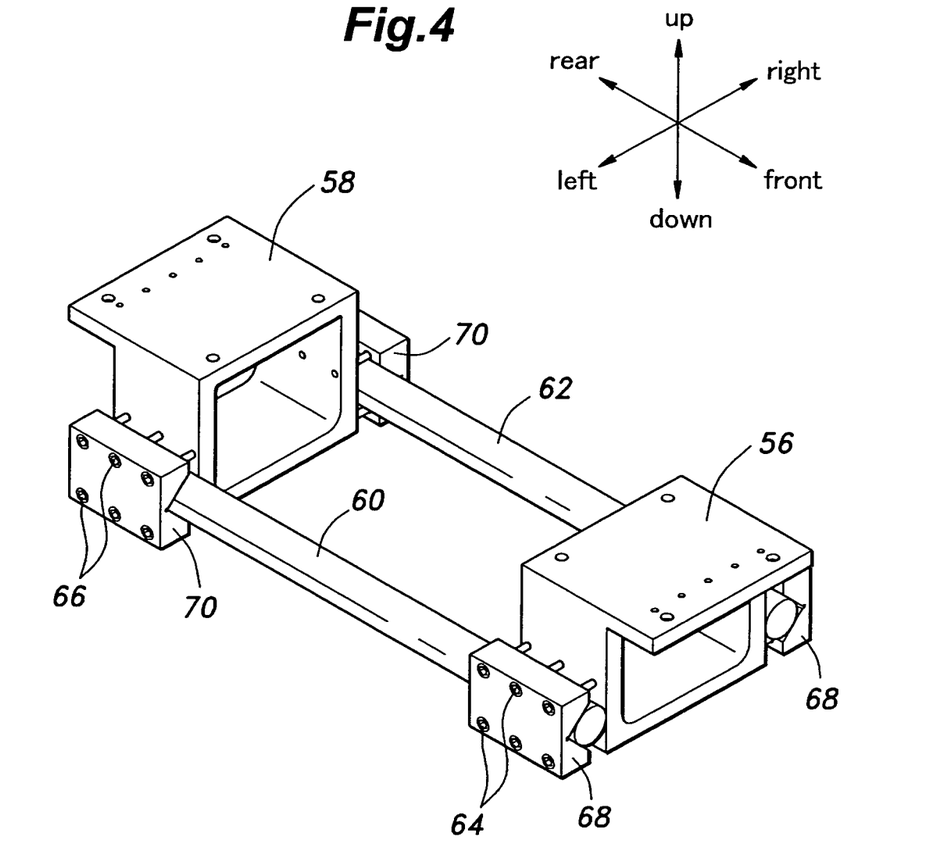
FIG. 4 is a perspective view of a sliders connecting mechanism of the parallel slider device using a pneumatic linear guide given as the embodiment of the present invention.

This mechanical coupling is accomplished by clamping each end of each connecting rod against a (flat) side face of the corresponding connecting base member 56, 58 by using a V-block clamping member 68, 70 so that a high lateral positioning precision can be achieved.

A micro movement table unit 90 including a table 88 that can be moved in the fore and aft direction is mounted on the front slider 44, and a displacement meter 92 is mounted on the table 88. The displacement meter 92 may consist of a non-contact sensor such as a capacitive displacement meter, and is placed at a height corresponding to the center of the measuring object consisting of a silicon wafer W mounted on the annular rotatable member 16 to measure the distance to the opposing front surface of the silicon wafer W.

Likewise, a micro movement table unit 96 including a table 94 that can be moved in the fore and aft direction is mounted on the rear slider 50, and a displacement meter 98 is mounted on the table 94. The displacement meter 98 may also consist of a non-contact sensor such as a capacitive displacement meter, and is placed at a height corresponding to the center of the measuring object consisting of a silicon wafer W mounted on the annular rotatable member 16 to measure the distance to the opposing rear surface of the silicon wafer W.

The flatness of the silicon wafer W is measured by scanning the displacement meters 92 and 98 diametrically across the silicon wafer W by traversing the front slider 44 and the rear slider 50 while the silicon wafer W is rotated by the annular rotatable member 16, and measuring the distances between the displacement meter 92 and the front surface of the silicon wafer W and between the displacement meter 98 and the rear surface of the silicon wafer W.

A stator member 74 of a front linear servo motor 72 is fixedly attached to a part of the base unit 10 located in front of the front guide rail 40 via a bracket 76. The stator member 74 is laterally elongated and extends in parallel with the front guide rail 40. A mover member 78 of the front linear servo motor 72 is fixedly attached the front slider 44. Thereby, the front slider 44 can be actuated by the front linear servo motor 72 in the lateral direction.

A stator member 82 of a rear linear servo motor 80 is fixedly attached to a part of the base unit 10 located behind the rear guide rail 42 via a bracket 84. The stator member 82 is laterally elongated and extends in parallel with the rear guide rail 42. A mover member 86 of the rear linear servo motor 80 is fixedly attached the rear slider 50. Thereby, the rear slider 50 can be actuated by the rear linear servo motor 80 in the lateral direction.

As shown in FIG. 5, a front linear scale 100 is provided between the front guide rail 40 and the front slider 44, and a rear linear scale 102 is provided between the rear guide rail 42 and the rear slider 50 so that the lateral positions of the front slider 44 and the rear slider 50 can be detected.

An embodiment of a control device for the parallel slider device described above is now described in the following with reference to FIG. 5.

This control device comprises a front servo controller 100 or a first position control unit for controlling the operation of the front linear servo motor 72, a rear servo controller 130 or a second position control unit for controlling the operation of the rear linear servo motor 80 and a position command generator 140 which is commonly provided for the front and rear servo controllers 100 and 130.

The position command generator 140 may consist of a pulse train command type position command generator that provides a pulse signal to each of the front and rear servo controllers 100 and 130 as a positioning command at a pulse rate corresponding to the traveling speed of the corresponding slider 44, 50 or of a pulse count corresponding to the displacement of the corresponding slider 44, 50.

The front servo controller 100 includes a position loop, a speed loop and an acceleration loop in a cascade connection, and comprises a position deviation computing unit 112 that computes a deviation (positional deviation) between the position command generated by the position command generator 140 and the actual position of the front slider 44 detected by the front linear scale 100, a position loop gain setting unit 114 that generates a speed command by applying a position loop gain to the position deviation produced from the position deviation computing unit 112, a speed deviation computing unit 116 that computes a deviation (speed deviation) between the speed command generated from the position loop gain setting unit 114 and the actual speed of the front slider 44 obtained by differentiating the actual position signal of the front slider 44 generated from the front liner scale 100, a speed loop gain setting unit 118 that generates an acceleration command by applying a speed loop gain to the speed deviation produced from the speed deviation computing unit 116, an acceleration deviation computing unit 120 that computes a deviation between the acceleration command produced from the speed loop gain setting unit 118 and the actual acceleration of the front slider 44 obtained by twice differentiating the actual position information of the front slider 44 produced by the front linear scale 100, and an acceleration loop gain setting unit 122 that forwards a pulse command to the front linear servo motor 72 by applying an acceleration loop gain to the acceleration deviation produced from the acceleration deviation computing unit 120.

The position loop gain unit setting unit 114 may be based on a PI control including a proportional element applying a proportional gain to a position deviation value and an integral element applying an integral gain to an integrated value of the position deviation, or a PID control including a differential element applying a differential gain to a differentiated value of the position deviation in addition to a proportional element and an integral element, and the gains of the various elements are appropriately selected in the actual PI or PID control.

The rear servo controller 130 includes a position loop and a speed loop in a cascade connection, and comprises a position deviation computing 132 that computes a deviation between the position command produced from the position command generator 140 and the actual position of the rear slider 50 detected by the rear linear scale 102, a position loop gain setting unit 134 that generates a speed command by applying a position loop gain to the position deviation produced by the position deviation computing unit 132, a speed deviation computing unit 136 that computes a deviation (speed deviation) between the speed command produced by the position loop gain setting unit 134 and the actual speed of the rear slider 50 obtained by differentiating the actual position signal of the rear slider 50 produced by the rear linear scale 102, and a speed loop gain setting unit 138 that forwards a pulse command to the rear linear servo motor 80 by applying a speed loop gain to the speed deviation produced by the speed deviation computing unit 136.

As the front slider 44 and the rear slider 50 are mechanically coupled with each other, the two sliders 44 and 50 move integrally fast to each other. Therefore, the front servo controller 100 and the rear servo controller 130 receive a same position command from the common position command generator 140.

Therefore, the position control of the front linear servo motor 72 and the rear linear servo motor 80 are individually performed by a fully closed-loop feedback control using the actual positions of the front slider 44 and the rear slider 50 detected by the aforementioned linear scales 100 and 102 as the feedback information, respectively, such that the lateral positions (scan positions) of the front slider 44 and the rear slider 50 are synchronized or made to coincide with each other.

An important point of the illustrated embodiment of the present invention is that, as discussed above, the rear servo controller 130 includes only the position loop and the speed loop whereas the front servo controller 100 includes the position loop, the speed loop and the acceleration loop, and the two controllers include different number of loops in cascade connection.

As a result, the effective control gain of the front servo controller 100 differs from that of the rear servo controller 130. In this case, the effective control gain of the front servo controller 100 is greater than the effective control gain of the rear servo controller 130. In particular, the control gain of the front servo controller 100 is set to an optimum value (an optimum value in the feedback control) obtained by a system identification process whereas the control gain of the rear servo controller 130 is selected as a value smaller than the optimum value obtained by a system identification process. In particular, the acceleration loop is highly powerful in causing the controlled value to converge to the target value than the position loop and the speed loop, and significantly contributes to a high gain behavior of the system.

Furthermore, the front servo controller 100 is PI or PID controlled while the rear servo controller 130 is only P controlled. This also causes the effective control gain of the front servo controller 100 to be greater than that of the rear servo controller 130.

At any event, it suffices if the effective control gain of the front servo controller 100 is set at an optimum value as obtained by a system identification process, and the effective control gain of the rear servo controller 130 is lower than the optimum value, as a net result of varying the effective control gain caused by the selection of the mode of cascade connection of the various control loops and the selection of the use of the PID control elements.

Therefore, the front servo controller 100 having a higher control gain may be considered as a master side and the rear servo controller 102 having a lower control gain may be considered as a slave side such that the rear slider 50 on the slave side follows the movement of the front slider 44 on the master side, and the smooth movement of both the sliders is ensured.

In the foregoing embodiment, the effective control gain was caused by both the selection of the mode of cascade connection of the various control loops and the selection of the use of the PID control elements. However, in terms of determining the net gain, it suffices if the effective control gain is caused to be varied by either the selection of the mode of cascade connection of the various control loops or the selection of the use of the PID control elements. Further, the variation of the effective control gains of the front servo controller and the rear servo controller can also be effected by varying the gain (time constant) of each or any of the control loops.

Although the present invention has been described in terms of a preferred embodiment thereof, it is obvious to a person skilled in the art that various alterations and modifications are possible without departing from the scope of the present invention.

The invention claimed is:

1. A control device for a parallel slider device, the parallel slider device comprising a first guide rail and a second guide rail that are disposed parallel to each other, a first slider and a second slider slidably supported by the first and second guide rails, respectively, along a lengthwise direction of the guide rails, a coupling means for mechanically coupling the first and second sliders to each other and a first electric servo actuator and a second electric servo actuator for driving the first slider and a second slider, respectively, in the lengthwise direction of the guide rails,
wherein the control device comprises a first position control unit for controlling an operation of the first electric servo actuator and a second position control unit for controlling an operation of the second electric servo actuator, and
wherein a same position command is given to the first and second position control units, and the first and second position control units are provided with mutually different control gains.

2. The control device for a parallel slider device according to claim 1, wherein the control gain for the first position control unit consists of an optimum value based on a system identification, and the control gain for the second position control unit consists of a value smaller than the optimum value based on a system identification.

3. The control device for a parallel slider device according to claim 1, wherein the first position control unit and the second position control unit each consist of a feedback compensation control device, and the control gain comprises a position loop gain set by a position loop gain setting unit for each of the first and second position control units, and
wherein the position loop gain setting unit for the first position control unit is configured to set a gain for a PI control including a proportional control element and an integral control element or for a PID control including a proportional control element, an integral control element and a differential control element, and
the position loop gain setting unit for the second position control unit is configured to set a gain for a P control including only a proportional control element.

4. The control device for a parallel slider device according to claim 1, wherein the first position control unit and the second position control unit each consist of a feedback compensation control device, and wherein the first position control unit includes a position loop, a speed loop and an acceleration loop in cascade connection, and the second position control unit includes a position loop and a speed loop in cascade connection.

5. A control method for a parallel slider device, the parallel slider device comprising a first guide rail and a second guide rail that are disposed parallel to each other, a first slider and a second slider slidably supported by the first and second guide rails, respectively, along a lengthwise direction of the guide rails, a coupling means for mechanically coupling the first and second sliders to each other and a first electric servo actuator and a second electric servo actuator for driving the first slider and a second slider, respectively, in the lengthwise direction of the guide rails,
wherein an operation of the first electric servo actuator is controlled by a first position control unit and an operation of the second electric servo actuator is controlled by a second position control unit, and
wherein a same position command is given to the first and second position control units, and the first and second position control units are provided with mutually different control gains.

6. The control method for a parallel slider device according to claim 5, wherein the control gain for the first position control unit consists of an optimum value based on a system identification, and the control gain for the second position control unit consists of a value smaller than the optimum value based on a system identification.

7. The control method for a parallel slider device according to claim 1, wherein the first position control unit and the second position control unit each consist of a feedback compensation control device, and the control gain comprises a position loop gain set by a position loop gain setting unit for each of the first and second position control units, and
wherein the position loop gain setting unit for the first position control unit is configured to set a gain for a PI control including a proportional control element and an integral control element or for a PID control including a proportional control element, an integral control element and a differential control element, and the position loop gain setting unit for the second position control unit is configured to set a gain for a P control including only a proportional control element.

8. The control method for a parallel slider device according to claim 5, wherein the first position control unit and the second position control unit each consist of a feedback compensation control device, and wherein the first position control unit includes a position loop, a speed loop and an acceleration loop in cascade connection, and the second position control unit includes a position loop and a speed loop in cascade connection.

9. A measuring device, comprising:
a first guide rail and a second guide rail that are disposed parallel to each other;
a first slider and a second slider slidably supported by the first and second guide rails, respectively, along a lengthwise direction of the guide rails;
a coupling means for mechanically coupling the first and second sliders to each other;
a first electric servo actuator and a second electric servo actuator for driving the first slider and a second slider, respectively, in the lengthwise direction of the guide rails;
a support unit disposed between the first guide rail and the second guide rail to support a measuring object;
a first measuring means mounted on the first slider for measuring a distance to a first side of the measuring object;

a second measuring means mounted on the second slider for measuring a distance to a second side of the measuring object; and a control device for a parallel slider device as defined in claim 1.

10. A measuring device, comprising:

a first guide rail and a second guide rail that are disposed parallel to each other;

a first slider and a second slider slidably supported by the first and second guide rails, respectively, along a lengthwise direction of the guide rails;

a coupling means for mechanically coupling the first and second sliders to each other;

a first electric servo actuator and a second electric servo actuator for driving the first slider and a second slider, respectively, in the lengthwise direction of the guide rails;

a support unit disposed between the first guide rail and the second guide rail to support a measuring object;

a first measuring means mounted on the first slider for measuring a distance to a first side of the measuring object;

a second measuring means mounted on the second slider for measuring a distance to a second side of the measuring object; and a control device for a parallel slider device as defined in claim 2.

11. A measuring device, comprising:

a first guide rail and a second guide rail that are disposed parallel to each other;

a first slider and a second slider slidably supported by the first and second guide rails, respectively, along a lengthwise direction of the guide rails;

a coupling means for mechanically coupling the first and second sliders to each other;

a first electric servo actuator and a second electric servo actuator for driving the first slider and a second slider, respectively, in the lengthwise direction of the guide rails;

a support unit disposed between the first guide rail and the second guide rail to support a measuring object;

a first measuring means mounted on the first slider for measuring a distance to a first side of the measuring object;

a second measuring means mounted on the second slider for measuring a distance to a second side of the measuring object; and a control device for a parallel slider device as defined in claim 3.

12. A measuring device, comprising:

a first guide rail and a second guide rail that are disposed parallel to each other;

a first slider and a second slider slidably supported by the first and second guide rails, respectively, along a lengthwise direction of the guide rails;

a coupling means for mechanically coupling the first and second sliders to each other;

a first electric servo actuator and a second electric servo actuator for driving the first slider and a second slider, respectively, in the lengthwise direction of the guide rails;

a support unit disposed between the first guide rail and the second guide rail to support a measuring object;

a first measuring means mounted on the first slider for measuring a distance to a first side of the measuring object;

a second measuring means mounted on the second slider for measuring a distance to a second side of the measuring object; and a control device for a parallel slider device as defined in claim 4.

* * * * *